United States Patent [19]
Horaguchi

[11] Patent Number: 6,118,554
[45] Date of Patent: Sep. 12, 2000

[54] IMAGE READING APPARATUS INCORPORATING CONNECTOR BOARD FOR ELECTRICAL CONNECTION AND TESTING

[75] Inventor: Yoichi Horaguchi, Tajimi, Japan

[73] Assignee: Brother Kogyo Kabushiki Kaisha, Nagoya, Japan

[21] Appl. No.: 08/969,016

[22] Filed: Nov. 12, 1997

[30] Foreign Application Priority Data

Nov. 18, 1996 [JP] Japan ..................................... 8-306386

[51] Int. Cl.⁷ .............................. H04N 1/00; H04N 1/04; H01R 9/09; H01R 25/00
[52] U.S. Cl. .......................... 358/474; 439/76.1; 439/638; 358/406
[58] Field of Search ..................................... 358/474, 482, 358/483, 496, 497, 498, 471, 400, 406; 382/314, 315, 312, 321; 399/90; 439/76.1, 638

[56] References Cited

U.S. PATENT DOCUMENTS

| | | |
|---|---|---|
| 4,816,921 | 3/1989 | Akiyama et al. ........................ 358/293 |
| 4,835,394 | 5/1989 | Steele ..................................... 250/385.1 |
| 4,963,824 | 10/1990 | Hsieh et al. ......................... 324/158 R |
| 5,561,499 | 10/1996 | Setoriyama .............................. 355/202 |
| 5,743,750 | 4/1998 | Sullivan et al. ........................ 439/76.1 |
| 5,822,081 | 10/1998 | Hatano et al. ........................... 358/400 |

*Primary Examiner*—Joseph Mancuso
*Assistant Examiner*—Hien Truong
*Attorney, Agent, or Firm*—Oliff & Berridge, PLC

[57] ABSTRACT

An image reading apparatus includes a light source for irradiating a document paper with light, and a photoelectric conversion unit for detecting the light reflected by the paper. The light source is connected to a first harness which is connected to a connector board via a first connector. The photoelectric conversion unit is connected to the second harness which is also connected to the connector board via a second connector. A third harness is further connected to the connector board via a third connector for power supply and signal transmission. The connector board is formed with a plurality of test pads used for connection to an outside test apparatus without detaching the first and second connectors from the connector board.

13 Claims, 5 Drawing Sheets

IMAGE READING APPARATUS INCORPORATING CONNECTOR BOARD FOR ELECTRICAL CONNECTION AND TESTING

BACKGROUND OF THE INVENTION

1. Field of the Invention

The present invention relates to an image reading apparatus for use in a facsimile machine or photocopying machine for example. The present invention also relates to a connector board for incorporation in such an image reading apparatus. The present invention further relates to a test jig which may be advantageously used in combination with such a connector board for testing an image reading apparatus.

2. Description of the Related Art

Typically, a prior art image reading apparatus comprises a light source for irradiating a document paper with light, a photoelectric conversion unit for receiving the light reflected by the document paper and for converting the received light into electric signals, a first harness connected to the light source, a second harness connected to the photoelectric conversion unit, a first connector board connected to the first harness via a first connector, a second connector board connected to the second harness via a second connector, and a control circuit board connected to the first and second connector boards, respectively. The photoelectric conversion unit comprises a plurality of CCD sensor chips mounted on a CCD board, and a lens system for collecting the light from the document paper for incidence to the CCD sensor chips.

In assembly of such an image reading apparatus, it is necessary to adjust the position of the lens system and the CCD board for proper focusing and image detection. For this purpose, a test paper is fed in the image reading apparatus for reading while the light source and the CCD board are connected to an outside testing apparatus. Specifically, the outside testing apparatus supplies power for actuating the light source while monitoring the detection signals from the CCD sensor chips. The CCD board and the lens system are positionally adjusted until the monitored detection signals become proper.

Conventionally, the first and second connectors for the first and second harnesses are removed from their respective connector boards and then reconnected to an intermediary board of the testing apparatus for electrically connecting the testing apparatus to the light source and the CCD board. After testing and positional adjustment of the CCD board and the lens system, the first and second connectors are removed from the intermediary board of the testing apparatus and then reconnected to the respective connector boards of the image reading apparatus. Therefore, the steps of testing and positionally adjusting the CCD board and the lens system can be burdensome and time-taking for the operator. Further, since the connectors are rather sensitive elements, care should be taken for removal and reconnection of the connectors.

SUMMARY OF THE INVENTION

It is, therefore, an object of the present invention is to provide an image reading apparatus which facilitates testing and positional adjustment of a photoelectric conversion unit.

Another object of the present invention is to provide a connector board which may be advantageously incorporated in an image reading apparatus or other electric or electronic apparatus for facilitating testing of an operative element or elements connected to the connector board.

A further object of the present invention is to provide a test jig which may be conveniently used for testing a photoelectric conversion unit of an image reading apparatus or an operative element of other electric or electronic apparatus.

According to a first aspect of the present invention, there is provided an image reading apparatus comprising: a light source for irradiating a document paper with light; a photoelectric conversion unit for receiving the light reflected by the document paper and for converting the received light into electric signals; a first harness connected to the light source; a second harness connected to the photoelectric conversion unit; a connector board connected to the first harness via a first connector, the connector board being connected to the second harness via a second connector; a third harness connected to the connector board via a third connector for power supply and signal transmission; and auxiliary connecting means provided on the connector board separately from the first to third connectors for electrically connecting the first and second harnesses to an outside test apparatus.

According to the arrangement described above, since the first and second connectors for the first and second harnesses are mounted on the single connector board, there is no need to prepare two separate connector boards for the first and second harnesses and to connect the two different harnesses to the two separate connector boards. Further, the third harness together with the third connector can be used commonly for the first and second harnesses for power supply and signal transmission. Thus, the harness arrangement of the image reading apparatus can be greatly simplified.

On the other hand, the auxiliary connecting means is normally idle but may be connected to the outside test apparatus only in assembly of the image reading apparatus for positional adjustment of the photoelectric conversion unit. At this time, since the auxiliary connecting means is provided separately from the first to third connectors, the first and second connectors do not need to be removed from the connector board for connection to the outside test apparatus. Thus, the steps of testing and positionally adjusting the photoelectric conversion unit can be greatly facilitated.

In practice, the image reading apparatus of the present invention may form part of a communication apparatus (e.g. facsimile machine) or a photocopying machine. Alternatively, the image reading apparatus may be an image scanner which may be typically connected to a personal computer.

The light source may comprise one or more LEDs, fluorescent lamps, or white light lamps for example. When utilizing LEDS as the light source, color images may be read by combination of red, green and blue LEDs.

The photoelectric conversion unit may comprise a lens system and a CCD sensor. However, other photoelectric sensor may be also used.

According to a preferred embodiment of the present invention, the connector board is formed with a circuit pattern for electrically connecting the third connector to the first and second connectors, and the circuit pattern includes a plurality of test pads (in the form of solder deposits for example) which serve as the auxiliary connecting means. In this case, use may be made of a test jig having a plurality of probes which are brought into contact with the test pads.

Thus, it is unnecessary to utilize a plug-socket type connector, so that testing and positional adjustment of the photoelectric conversion unit can be performed conveniently and quickly.

Preferably, the first to third connectors may be mounted on a head surface of the connector board, whereas the circuit pattern is formed on a tail surface of the connector board. Further, the test pads of the circuit pattern may be collectively disposed in a limited area on the tail surface of the connector board.

The image reading apparatus may further comprise a support frame for supporting the light source, the photoelectric conversion unit and the connector board, the support frame being formed with an access window in facing relation to said limited area of the tail surface of the connector board. With such an arrangement, the test jig can be conveniently brought into contact with the test pads of the connector board through the access window of the support frame.

According to a second aspect of the present invention, there is provided a combination of an image reading apparatus and a test jig, the image reading apparatus comprising: a light source for irradiating a document paper with light; a photoelectric conversion unit for receiving the light reflected by the document paper and for converting the received light into electric signals; a first harness connected to the light source; a second harness connected to the photoelectric conversion unit; a connector board connected to the first harness via a first connector, the connector board being connected to the second harness via a second connector; a third harness connected to the connector board via a third connector for power supply and signal transmission; and a circuit pattern formed on the connector board for electrically connecting the third connector to the first and second connectors, the circuit pattern including a plurality of test pads; the test jig comprising a plurality of probes in corresponding relation to the plurality of test pads for contact therewith.

According to a third aspect of the present invention, there is provided a connector board for use in an electric or electronic apparatus comprising: a surface for mounting at least two connectors; and a circuit pattern for electrically connecting said at least two connectors; wherein the circuit pattern includes a plurality of test pads.

According to a fourth aspect of the present invention, there is provided a combination of a connector board and a test jig for use in an electric or electronic apparatus, the connector board comprising: a surface for mounting at least two connectors; and a circuit pattern for electrically connecting said at least two connectors, the circuit pattern including a plurality of test pads; the test jig comprising a plurality of probes in corresponding relation to the plurality of test pads for contact therewith.

Other objects, features and advantages of the present invention will be apparent from the detailed description of a preferred embodiments given below with reference to the accompanying drawings.

DETAILED DESCRIPTION OF THE PREFERRED EMBODIMENT

The preferred embodiment of the present invention will be described below with reference to the accompanying drawings.

Figure 1:
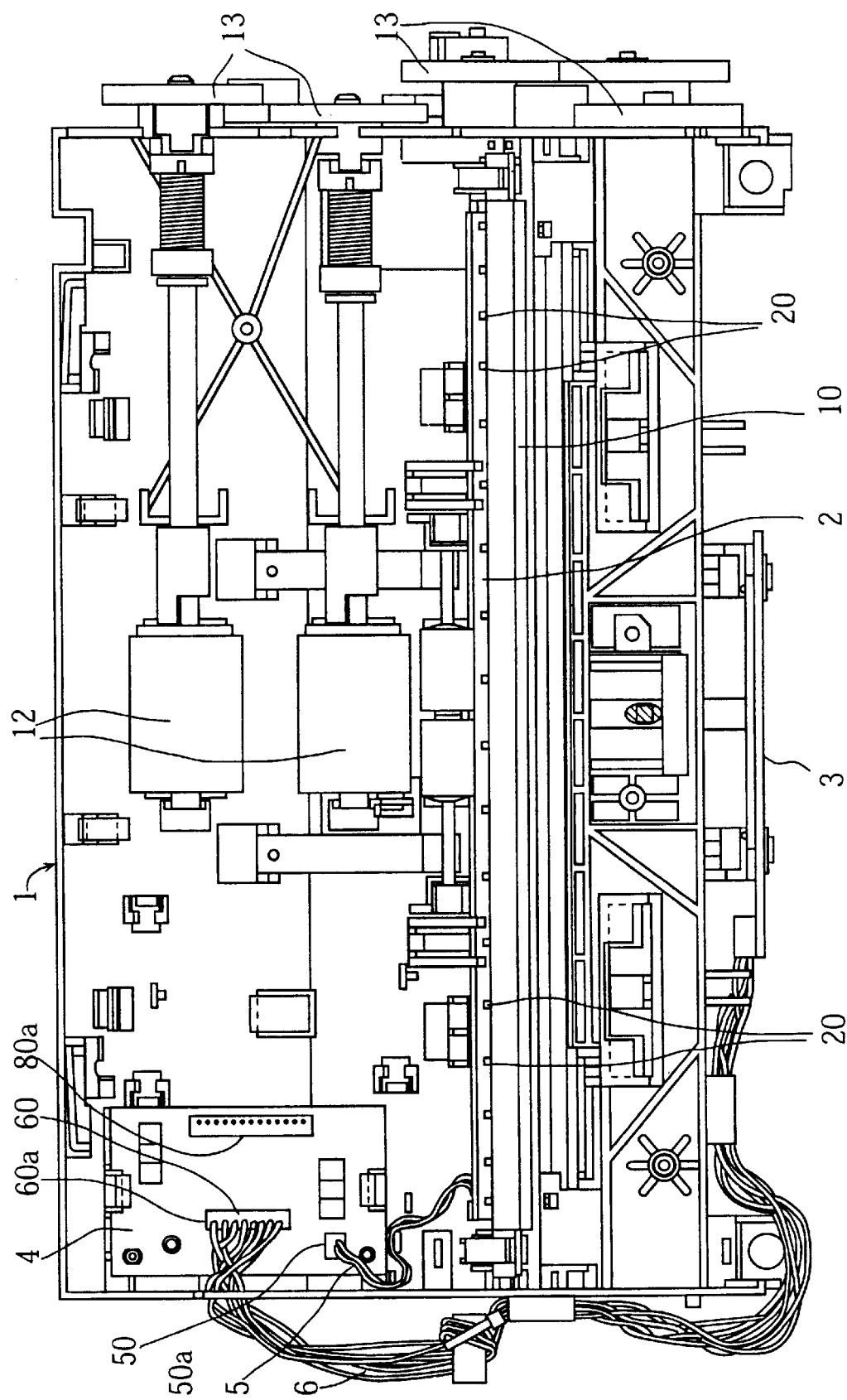
FIG. 1 is a plan view showing a principal portion of an image reading apparatus embodying the present invention.
Figure 2:
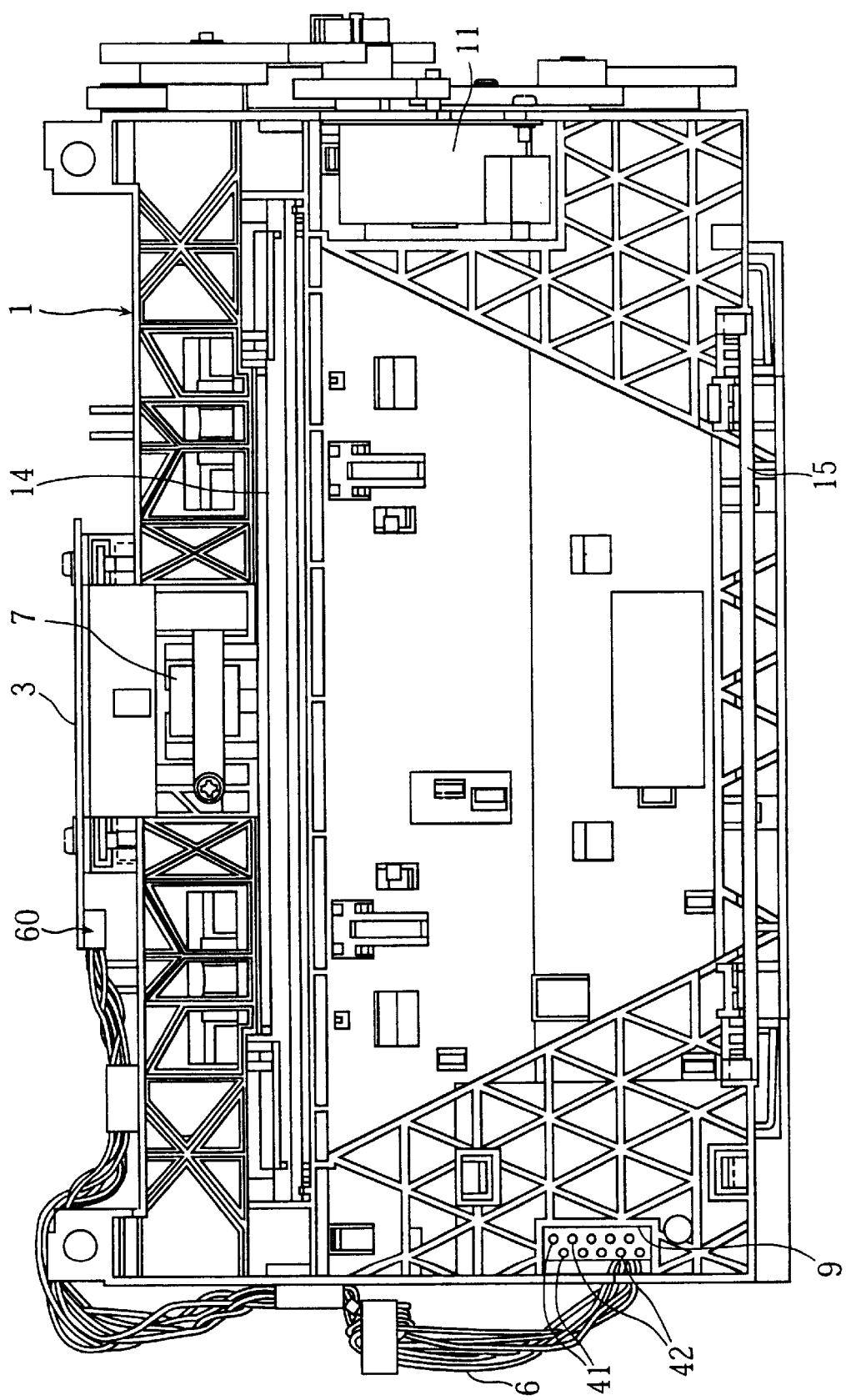
FIG. 2 is a bottom view showing the principal portion of the same image reading apparatus.
Figure 3:
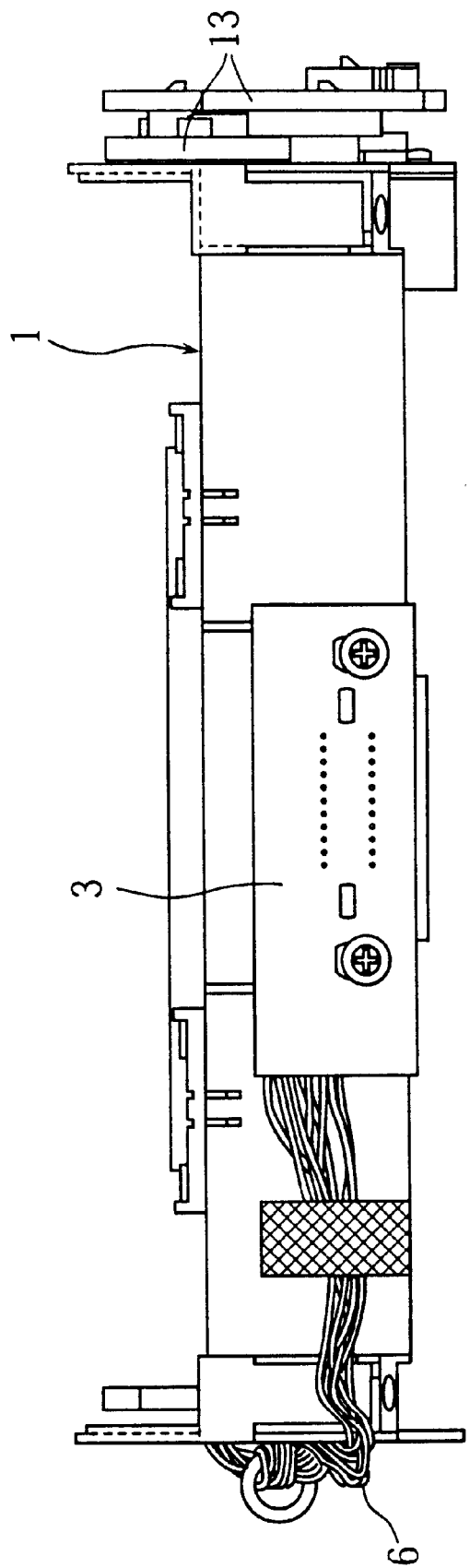
FIG. 3 is a front view showing the principal portion of the same image reading apparatus.

FIGS. 1 through 3 of the accompanying drawings illustrate an image reading apparatus embodying the present invention. The image reading apparatus comprises a support frame 1 housed in a machine body (not shown). The support frame 1 supports an LED board 2 (LED: Light Emitting Diode), a CCD board 3 (CCD: Charge Coupled Device), and a connector board 4.

The LED board 2 is sufficiently elongate to cover the entire width of any applicable document paper. The LED board 2 carries a plurality of LED chips 20 arranged in a longitudinal array as a light source for irradiating a document paper (not shown). One end of the LED board 2 is connected to one end of a first harness 5 (a bundle or group of cables) for power supply to the LED chips 20. The other end of the first harness 5 is connected to the connector board 4 via a first connector 50.

The CCD board 3 is also elongate but shorter than the LED board 2. The CCD board 3 carries a plurality of CCD sensor chips (not shown) in a known manner. One end of the CCD board 3 is connected to one end of a second harness 6 for power supply to the CCD sensor chips and for transmission of signals to and from the CCD sensor chips. The other end of the second harness 6 is connected to the connector board 4 via a second connector 60. Further, as schematically illustrated in FIG. 2, a lens 7 is arranged in facing relation to the CCD board 3 for effectively collecting light onto the respective CCD sensor chips.

Figure 4:
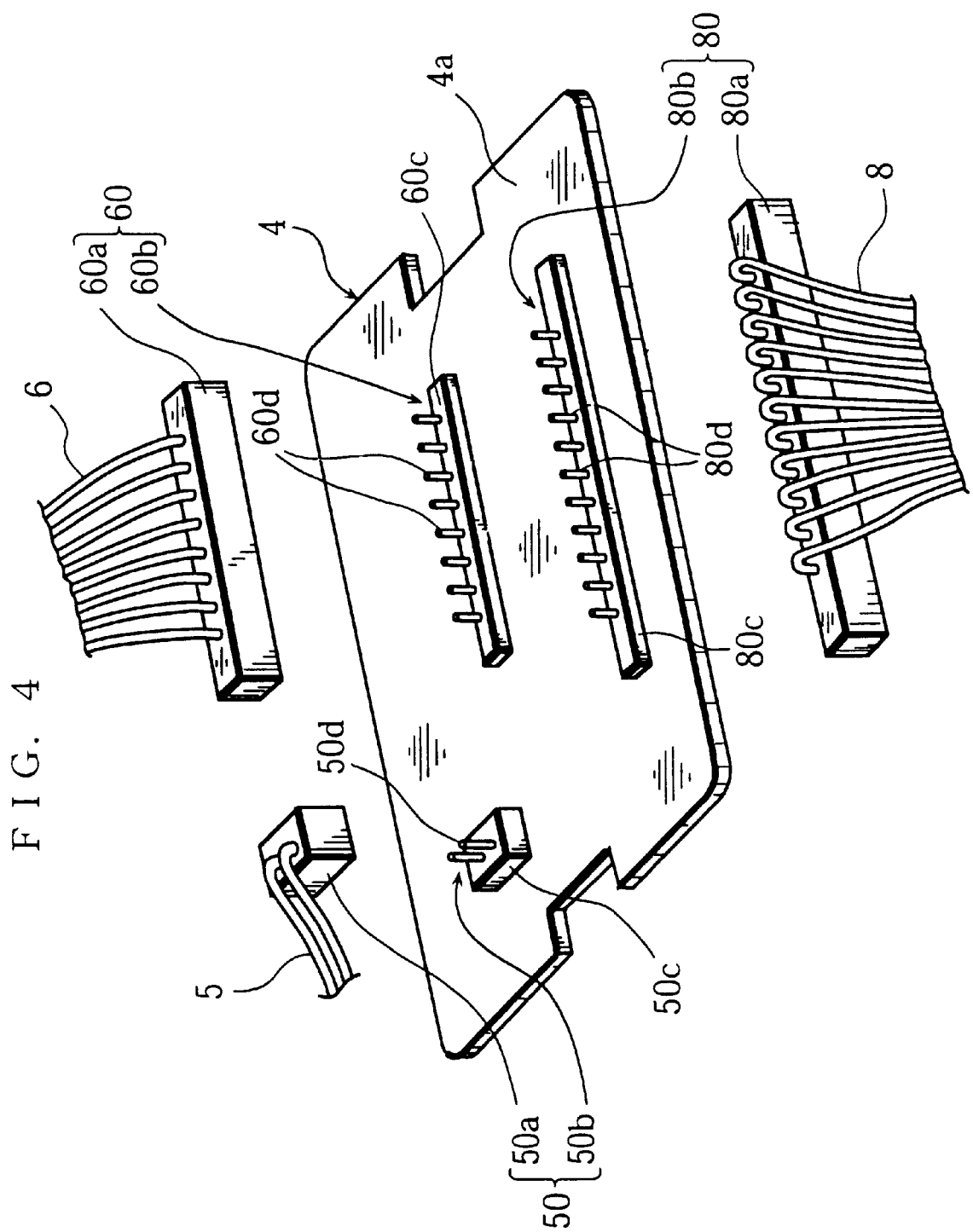
FIG. 4 is a perspective view showing a connector board incorporated in the same image reading apparatus.

As shown in FIGS. 1 and 4, the connector board 4, which is generally rectangular, is provided for electrically connecting the first and second harnesses 5, 6 to a control circuit board (not shown) in the machine body (not shown). Specifically, the connector board 4 is connected to a third harness 8 via a third connector 80, and the third harness 8 is connected to the control circuit board. Thus, the control circuit board provides power supply to the LED board 2 and the CCD board 3 while also transmitting and receiving signals to and from them through the first to third harnesses 5, 6, 8 and the connector board 4.

As shown in FIG. 4, the first connector 50 includes a first socket 50a connected to the first harness 5, and a first plug 50b mounted on a head surface 4a of the connector board 4. The first plug 50b includes a first base 50c resting on the head surface 4a of the connector board 4, and a first group of terminal pins 50d for insertion into the first socket 50a. The first group of terminal pins 50d also project toward a tail surface 4b of the connector board 4 for soldering at 50e, as shown in FIG. 5.

Similarly, the second connector 60 includes a second socket 60a connected to the second harness 6, and a second plug 60b mounted on the head surface 4a of the connector board 4. The second plug 60b includes a second base 60c resting on the head surface 4a of the connector board 4, and a second group of terminal pins 60d for insertion into the second socket 60a. The second group of terminal pins 60d also project toward the tail surface 4b of the connector board 4 for soldering at 60e, as shown in FIG. 5. It should be appreciated here that FIG. 4 shows only the connectors 50, 60, 80 for simplicity of illustration, but the head surface 4a of the connector board 4 actually carries other components.

Likewise, the third connector 8 includes a third socket 80a connected to the third harness 8, and a third plug 80b mounted on the head surface 4a of the connector board 4. The third plug 80b includes a third base 80c resting on the head surface 4a of the connector board 4, and a third group of terminal pins 80d for insertion into the third socket 80a. The third group of terminal pins 80d also project toward the tail surface 4b of the connector board 4 for soldering at 80e (see FIG. 5).

Figure 5:
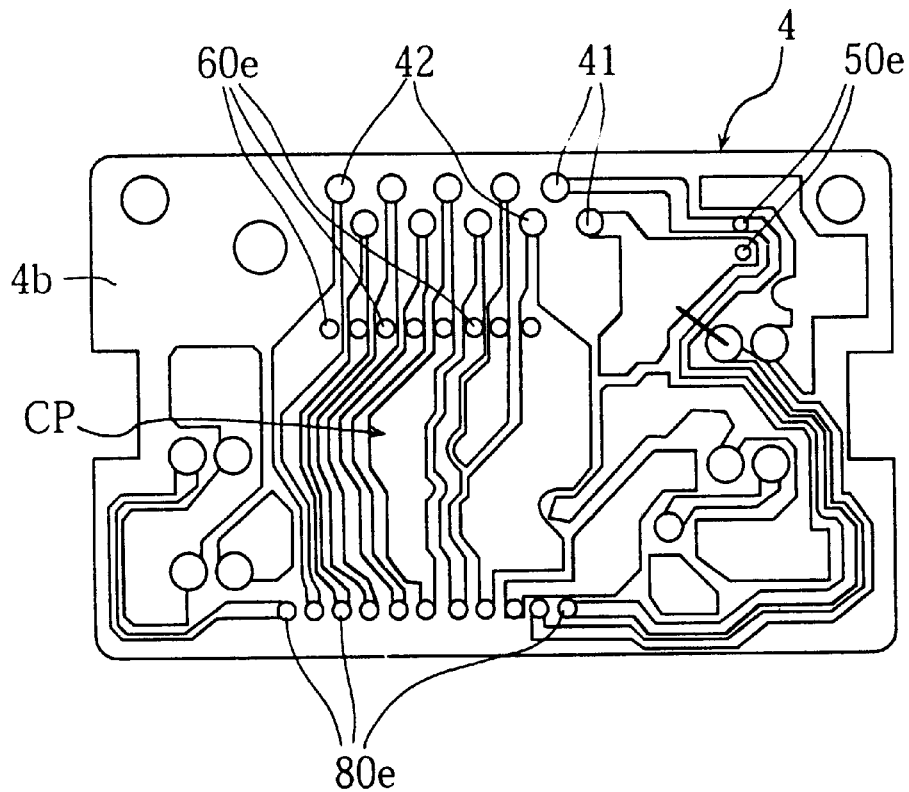
FIG. 5 is a bottom view showing the same connector board.

As shown in FIG. 5, the tail surface 4b of the connector board 4 is formed with a circuit pattern CP for connecting the third group of terminal pins 80d to the first and second groups of terminal pins 50d, 60d (see also FIG. 4), respectively. Further, the circuit pattern CP includes a first group of test pads 41 electrically connected to the first group of terminal pins 50d, and a second group of test pads 42 electrically connected to the second group of terminal pins 60d. The test pads 41, 42 of the first and second groups are collectively disposed in staggered relation in a limited area on the tail surface 4b of the connector board 4.

As shown in FIG. 2, the support frame 1 is provided with an access window 9 in facing relation to the tail surface 4b of the connector board 4. More specifically, the window 9 corresponds in position to the limited area of the tail surface 4b in which the first and second groups of test pads 41, 42 are disposed. Thus, the window 90 provides access to the first and second groups of test pads 41, 42 from outside for enabling test and adjustment, as described hereinafter.

As shown in FIGS. 1 and 2, the support frame 1 supports a light guide 10 for guiding light from the LED chips 20 toward a document paper (not shown). The support frame 1 further supports a paper feed motor 11, feed rollers 12, gears 13 for operatively connecting the motor 11 to the rollers 12, reflectors 14, 15 for guiding the light from the document paper toward the CCD board 3 (namely, the lens 7). Since these components are known and has nothing to do with the gist of the present invention, they are not shown in detail nor described any further.

In operation, the light emitted by the LED chips 20 are guided by the light guide 10 toward a document paper (not shown). The light reflected on the document paper is then reflected by the reflectors 14, 15 and collected by the lens 7 for incidence to the CCD sensor chips (not show) on the CCD board 3. The respective CCD sensor chips generate electric signals in accordance with the received light for supply to the connector board 4 through the second harness 6 and then to the control circuit board (not shown) through the third harness 8 (FIG. 4).

Figure 6:
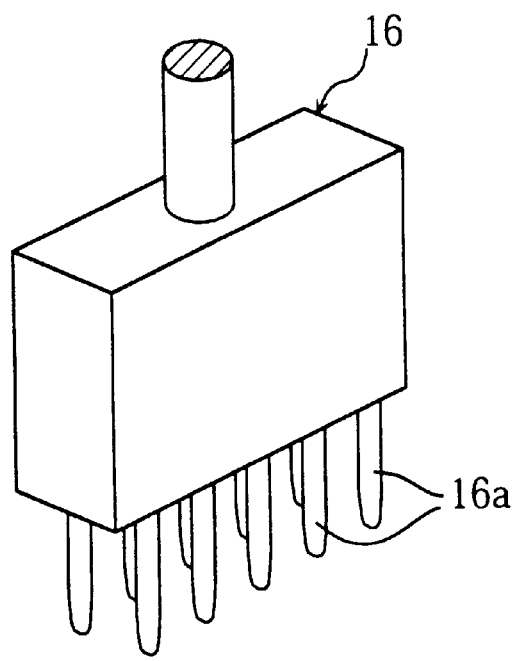
FIG. 6 is a perspective view showing a jig used for adjustment of the image reading apparatus.

In assembly of the image reading apparatus, the CCD board 3 and the lens 7 may be conveniently adjusted in position by using an outside positional test apparatus (not shown) which incorporates a jig 16, as shown in FIG. 6. More specifically, the jig 16 has a plurality of probes 16a arranged in corresponding relation to the first and second groups of test pads 41 (see FIGS. 2 and 5). The jig 16 is connected to a main unit (not shown) of the positional test apparatus for power supply and for transmission of signals to and from the main unit.

In use of the positional test apparatus, a test paper (not shown) is set at the predetermined paper feed position of the image reading apparatus, and the probes 16a of the jig 16 are brought into contact with the first and second group of test pads 41, 42 for power supply from the main unit of the positional test apparatus. As a result, the LED chips 20 generate light for irradiating the test paper under progressive feeding, and the light reflected from the test paper is detected by the CCD sensor chips which transmit corresponding detection signals to the main unit of the positional test apparatus. While monitoring the detection signals, the CCD board 3 and the lens 7 may be positionally adjusted until the detection signals become proper. Such positional adjustment of the CCD board 3 and the lens 7 may be performed manually by the operator or automatically by a positional adjusting mechanism.

According to the illustrated embodiment, the first and second groups of test pads 41, 42 are provided on the connector board 4 in addition to the first and second connectors 50, 60 but held in electrical conduction therewith. Thus, the first and second connectors 50, 60 may be held mounted on the connector board 4 in the course of the above-described positional adjustment, and it is unnecessary to remove the respective sockets 50a, 60a of the first and second connectors 50, 60 for connection to a separate intermediary board of a conventional testing apparatus. In this way, the steps of positionally adjusting the CCD board 3 and the lens 7 can be greatly simplified and facilitated. Further, the positional testing apparatus can be also simplified by the omission of an intermediary board.

The present invention being thus described, it is obvious that the same may be varied in many other ways. For instance, the access window 9 of the frame 1 may be formed to expose the entire tail surface 4b of the connector board. Further, the access window 9 may be dispensed with if the frame does not have a portion which conceals the tail surface 4b of the connector board. Such variations should not be regarded as a departure from the spirit and scope of the present invention, and all such modifications as would be obvious to those skilled in the art are intended to be included within the scope of the following claims.

I claim:

1. An image reading apparatus comprising:
    a support frame;
    a light source mounted on the support frame for irradiating a document paper with light;
    a photoelectric conversion unit mounted on the support frame for receiving the light reflected by the document paper and for converting the received light into electric signals;
    a first harness connected to the light source;
    a second harness connected to the photoelectric conversion unit;
    a connector board mounted on the support frame and connected to the first harness via a first connector, the connector board being connected to the second harness via a second connector;
    a third harness connected to the connector board via a third connector for power supply and signal transmission; and
    auxiliary connecting means provided on the connector board separately from the first to third connectors for electrically connecting the first and second harnesses to an outside test apparatus;
    wherein the support frame is formed with an access window for exposing the auxiliary connector means.

2. The image reading apparatus according to claim 1, wherein the connector board is formed with a circuit pattern for electrically connecting the third connector to the first and second connectors, the circuit pattern including a plurality of test pads which serve as the auxiliary connecting means.

3. The image reading apparatus according to claim 2, wherein the first to third connectors are mounted on a head surface of the connector board, the circuit pattern being formed on a tail surface of the connector board.

4. The image reading apparatus according to claim 3, wherein the access window faces the tail surface of the connector board.

5. The image reading apparatus according to claim 3, wherein the test pads of the circuit pattern is collectively disposed in a limited area on the tail surface of the connector board.

6. An apparatus comprising:
   a support frame;
   a connector board mounted on the connector board; and
   at least two connectors mounted on the connector board; and
   a functional unit mounted on the support frame in electrical connection to the connector board through one of said at least two connectors;
   wherein the connector board is provided with an auxiliary connecting means for electrically connecting the functional unit to an outside test unit; and
   wherein the support frame is formed with an access window for exposing the auxiliary connecting means and the functional unit is a photoelectric conversion unit.

7. The apparatus according to claim 6, wherein said at least two connectors are mounted on a head surface of the connector board, a tail surface of the connector board being formed with a circuit pattern for electrically connecting said at least two connectors, the circuit pattern including a plurality of test pads which serve as the auxiliary connecting means.

8. The apparatus according to claim 7, wherein the test pads of the circuit pattern are collectively disposed in a limited area on the tail surface of the connector board.

9. A combination of an apparatus and a test jig, the apparatus comprising:
   a support frame;
   a connector board mounted on the support frame;
   at least two connectors mounted on the connector board; and
   a functional unit mounted on the support frame in electrical connection to the connector board through one of said at least two connectors;
   wherein the connector board is provided with an auxiliary connecting means for electrically connecting the functional unit to an outside test unit;
   wherein the support frame is formed with an access window for exposing the auxiliary connecting means; and
   wherein the test jig comprises a plurality of probes for connection to the auxiliary connecting means through the access window and the functional unit is a photoelectric conversion unit.

10. The combination according to claim 9, wherein said at least two connectors are mounted on a head surface of the connector board, a tail surface of the connector board being formed with a circuit pattern for electrically connecting said at least two connectors, the circuit pattern including a plurality of test pads which serve as the auxiliary connecting means.

11. The combination according to claim 10, wherein the test pads of the circuit pattern are collectively disposed in a limited area on the tail surface of the connector board.

12. An apparatus comprising:
    a support frame;
    a connector board mounted on the support frame;
    at least two connectors mounted on the connector board; and
    a functional unit mounted on the support frame in electrical connection to the connector board through one of said at least two connectors;
    wherein the connector board is provided with an auxiliary connecting means for electrically connecting the functional unit to an outside test unit;
    wherein the support frame is formed with an access window for exposing the auxiliary connecting means;
    wherein said at least two connectors are mounted on a head surface of the connector board, a tail surface of the connector board being formed with a circuit pattern for electrically connecting said at least two connectors, the circuit pattern including a plurality of test pads which serve as the auxiliary connecting means; and
    wherein the test pads of the circuit pattern are collectively disposed in a limited are on the tail surface of the connector board.

13. A combination of an apparatus and a test jig, the apparatus comprising:
    a support frame;
    a connector board mounted on the support frame;
    at least two connectors mounted on the connector board; and
    a functional unit mounted on the support frame in electrical connection to the connector board through one of said at least two connectors;
    wherein the connector board is provided with an auxiliary connecting means for electrically connecting the functional unit to an outside test unit;
    wherein the support frame is formed with an access window for exposing the auxiliary connecting means;
    wherein the test jig comprises a plurality of probes for connection to the auxiliary connecting means through the access window;
    wherein said at least two connectors are mounted on a head surface of the connector board, a tail surface of the connector board being formed with a circuit pattern for electrically connecting said at least two connectors, the circuit pattern including a plurality of test pads which serve as the auxiliary connecting means; and
    wherein the test pads of the circuit pattern are collectively disposed in a limited area on the tail surface of the connector board.

* * * * *